(12) United States Patent
Ochiai et al.

(10) Patent No.: US 7,102,211 B2
(45) Date of Patent: Sep. 5, 2006

(54) SEMICONDUCTOR DEVICE AND HYBRID INTEGRATED CIRCUIT DEVICE

(75) Inventors: Isao Ochiai, Gunma (JP); Masato Take, Saitama (JP)

(73) Assignees: Sanyo Electric Co., Ltd., Osaka (JP); Kanto Sanyo Semiconductors Co., Ltd., Gunma (JP)

( * ) Notice: Subject to any disclaimer, the term of this patent is extended or adjusted under 35 U.S.C. 154(b) by 0 days.

(21) Appl. No.: 10/881,561

(22) Filed: Jun. 30, 2004

(65) Prior Publication Data
US 2005/0236706 A1  Oct. 27, 2005

(30) Foreign Application Priority Data
Jul. 1, 2003  (JP)  .......................... P. 2003-189633

(51) Int. Cl.
*H01L 23/495*  (2006.01)
(52) U.S. Cl. ...................... 257/666; 257/672; 257/695; 257/696
(58) Field of Classification Search ................ 257/666, 257/672, 674, 676, 677, E23.049; 438/123, 438/FOR. 365, FOR. 366, FOR. 380, 110, 438/111; 613/813
See application file for complete search history.

(56) References Cited

U.S. PATENT DOCUMENTS

| 4,482,915 A | * | 11/1984 | Nishikawa et al. ......... 257/669 |
| 5,495,125 A | * | 2/1996 | Uemura ..................... 257/666 |
| 5,903,050 A | * | 5/1999 | Thurairajaratnam et al. ..... 257/695 |

* cited by examiner

*Primary Examiner*—Jasmine Clark
(74) *Attorney, Agent, or Firm*—Fish & Richardson P.C.

(57) ABSTRACT

The related arts have difficulty in efficiently dissipating the heat generated by a resin-molded semiconductor element, and thus have the problem of thermal stress causing damage to the semiconductor element. To solve the problem, a semiconductor device of the preferred embodiments includes common leads coupled to an island, and a part of the common leads projects out from a resin seal body. The projecting common leads have a coupling portion. When mounting the semiconductor device, the common leads are bridged with brazing material. Thus, the heat generated by an integrated circuit chip mounted on the island is dissipated through the common leads to the outside of the resin seal body. In the preferred embodiments of the invention, a further improvement in heat dissipation characteristics can be accomplished by increasing the surface areas of the common leads.

12 Claims, 8 Drawing Sheets

PRIOR ART

PRIOR ART

SEMICONDUCTOR DEVICE AND HYBRID INTEGRATED CIRCUIT DEVICE

BACKGROUND OF THE INVENTION

1. Field of the Invention

The present invention relates to a semiconductor device using a lead frame including discrete leads and common leads, and more particularly to a semiconductor device including common leads of which outer portions have a coupling portion and which are bridged with brazing material (e.g., solder or the like) in order to enhance a heat dissipation effect.

2. Description of the Related Art

Recently, higher-density semiconductor devices have been sought in order to comply with smaller-sized electronic equipment. Thus, an approach has been carried out, which involves mounting on a lead frame an integrated circuit chip having various LSI (large scale integrated) circuits, and encapsulating with resin the integrated circuit chip mounted on the lead frame.

The description is given with regard to a conventional semiconductor device with reference to FIGS. 8 to 10.

FIG. 8 is a plan view of a conventional lead frame having an integrated circuit chip mounted thereon. FIG. 9 is a perspective view of a semiconductor device using the lead frame. FIG. 10 is a perspective view of the semiconductor device using the lead frame as mounted on a conductive pattern.

As shown in FIG. 8, a lead frame 1 includes an island 3 on which an integrated circuit chip 2 is mounted, and a plurality of leads 4A, 4B, 4C, . . . , and 5A, 5B, 5C, . . . , which act as external electrode terminals. The leads 4A and the like are arranged in DIP (dual in-line package) form and spaced at predetermined intervals.

The integrated circuit chip 2 is mounted on the island 3 of the lead frame 1. Electrodes 6A, 6B, 6C, . . . , and 7A, 7B, 7C, . . . placed on the integrated circuit chip 2 are respectively bonded to the leads 4A and the like through fine metal wires 8A, 8B, 8C, . . . , and 9A, 9B, 9C, . . .

As shown in FIG. 9, a resin-sealing body 10 is formed so that the outer portions of the leads 4A and the like are exposed to the outside thereof, and thus a semiconductor device 11 is completed.

As shown in FIG. 10, in the semiconductor device 11, the ends of the leads 4A and the like are brazed (e.g., soldered or otherwise bonded) to conductive patterns 14A, 14B, 14C, and the like on a printed wiring board 12.

As mentioned above, the semiconductor device includes the integrated circuit chip, which is increasing in size year by year. Thus, the heat generated by the integrated circuit chip and the like can cause thermal damage to the integrated circuit chip or the semiconductor device. Although it is therefore necessary to improve heat dissipation characteristics of the semiconductor device, the semiconductor device has the problem of inadequate heat dissipation because the integrated circuit chip and the island having the chip mounted thereon are integrally molded with resin. Moreover, the lead frame having a larger number of pins becomes thinner and thus there was the problem of impairing the heat dissipation characteristics.

SUMMARY OF THE INVENTION

The preferred embodiments of the present invention are designed to overcome the foregoing problems. A semiconductor device of the preferred embodiments includes: an island on which a semiconductor element is mounted; a plurality of discrete leads of which ends extend near the island; a plurality of common leads coupled to the island; and a resin-sealing body molding the semiconductor element, the island, the discrete leads, and the common leads with resin, wherein the common leads projecting out from the resin-sealing body are provided with a coupling portion. With this structure, the semiconductor device can dissipate the heat through the common leads coupled to the island to the outside of the resin-sealing body. Therefore, heat dissipation characteristics of the semiconductor device can be improved.

Moreover, a hybrid integrated circuit device of the preferred embodiments includes: a conductive pattern formed at least on a surface of a hybrid integrated circuit board; a semiconductor element or a passive element mounted on the conductive pattern; a lead connected to the conductive pattern and extending outside, the lead acting as an output or an input; and a resin-sealing body made of thermosetting resin, which coats at least the surface of the board by transfer molding, wherein the lead has common leads in its region projecting out from the resin-sealing body, and the common leads are coupled by a coupling portion. With this structure, the hybrid integrated circuit device including the transfermolded hybrid integrated circuit board can dissipate the heat to the outside of the resin-sealing body. Therefore, heat dissipation characteristics of the hybrid integrated circuit device can be improved.

DETAILED DESCRIPTION OF THE INVENTION

Firstly, the description is given with reference to FIGS. 1 to 4 with regard to a semiconductor device according to a first embodiment of the present invention.

Figure 1:
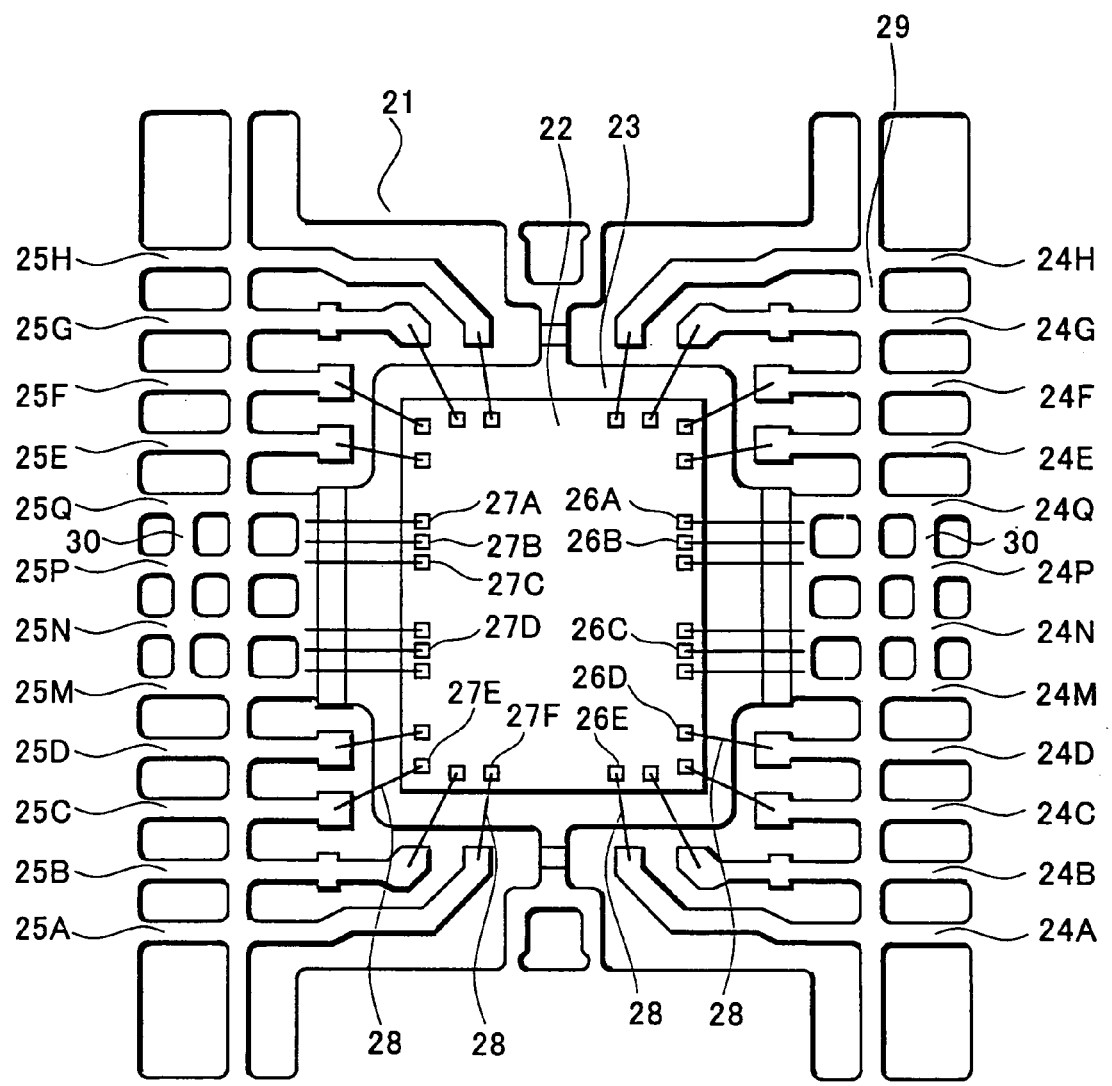
FIG. 1 is a plan view explaining a lead frame for use in a semiconductor device according to a first embodiment of the present invention.
Figure 2:
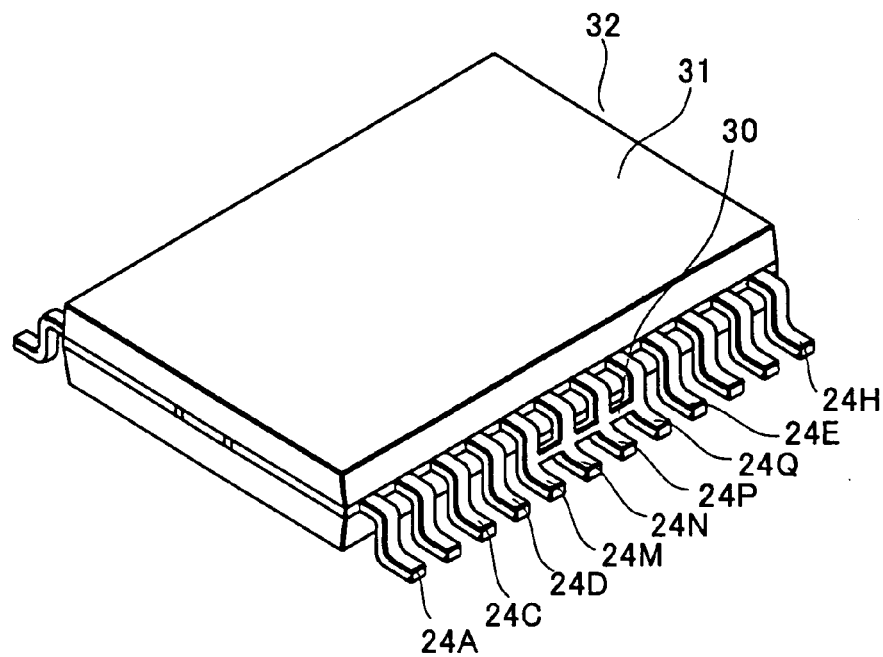
FIG. 2 is a perspective view explaining the semiconductor device according to the first embodiment of the invention.
Figure 3:
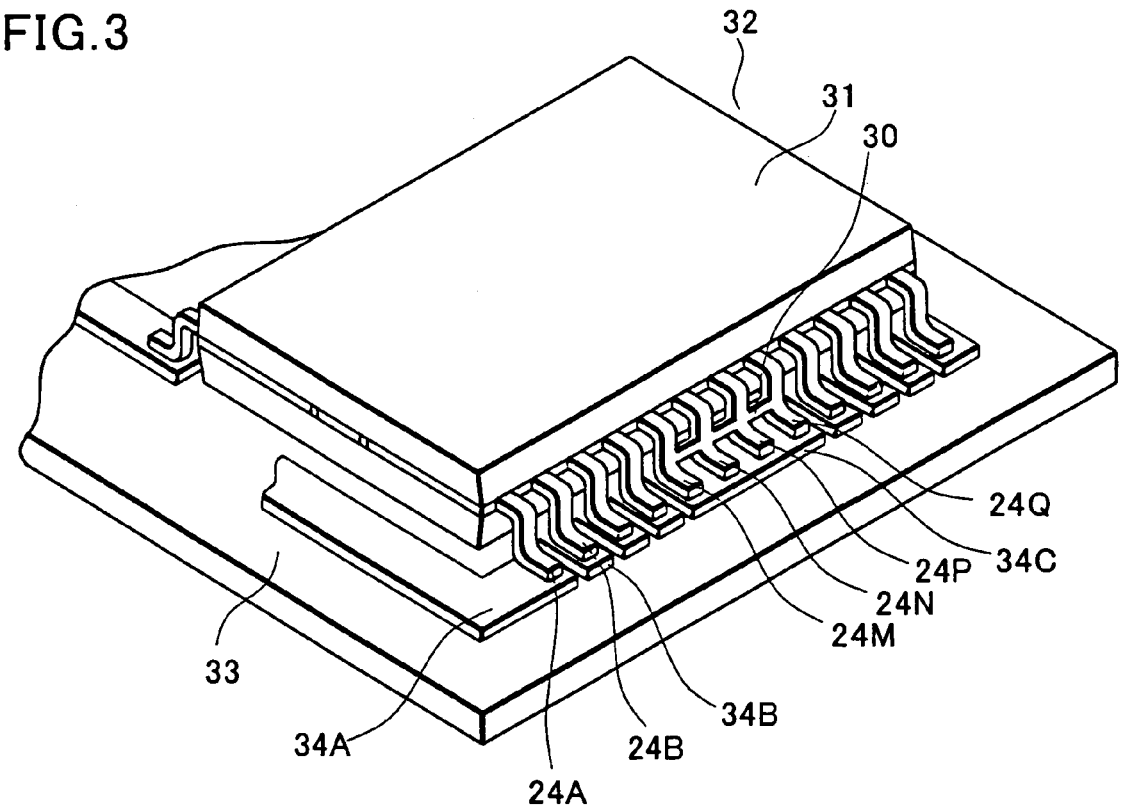
FIG. 3 is a perspective view explaining the semiconductor device according to the first embodiment of the invention as mounted on a conductive pattern.
Figure 4:
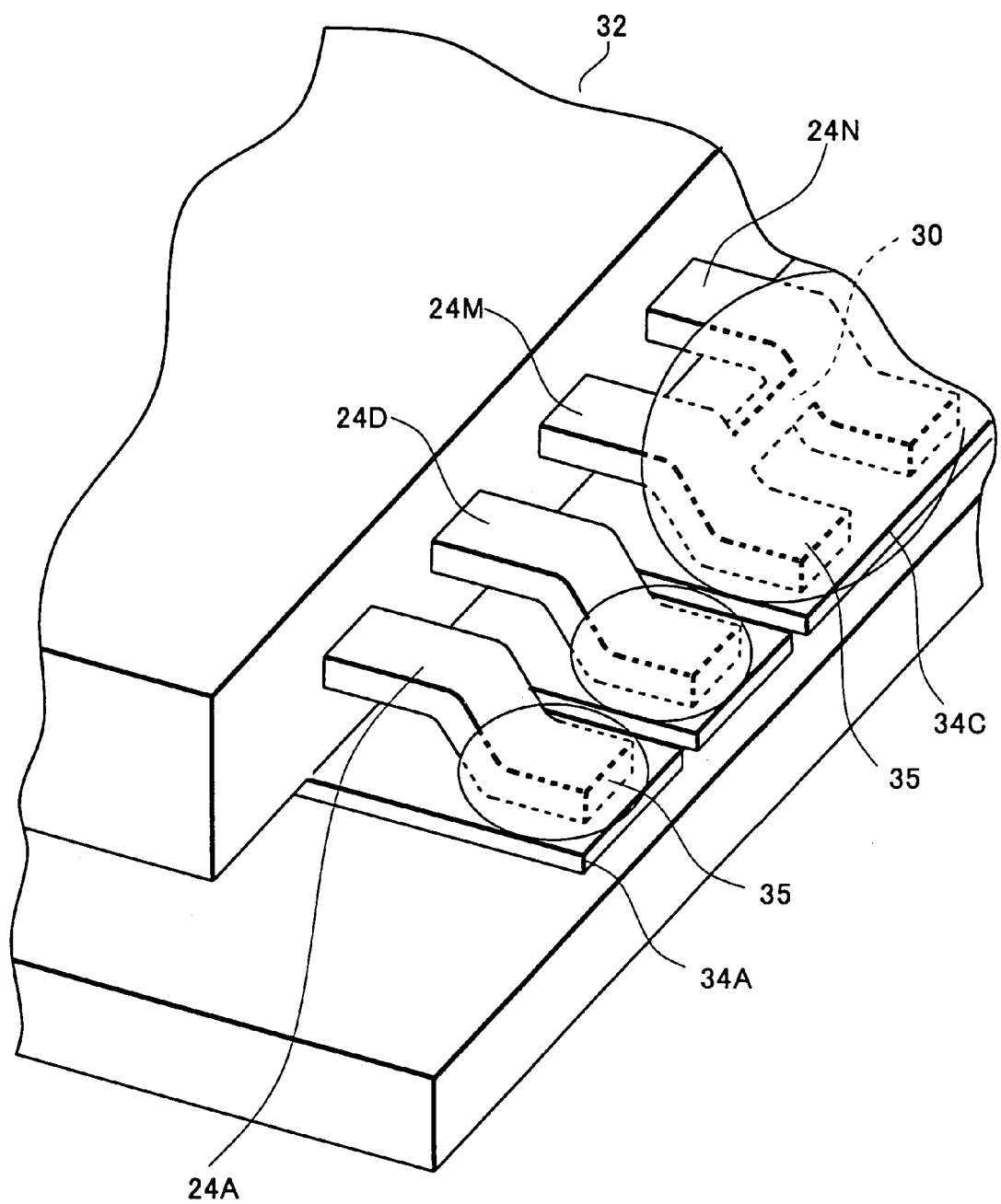
FIG. 4 is an enlarged partial perspective view of the semiconductor device according to the first embodiment of the invention as mounted on the conductive pattern.

FIG. 1 is a plan view explaining a lead frame for use in this embodiment. FIG. 2 is a perspective view explaining the semiconductor device according to this embodiment. FIG. 3 is a perspective view explaining the semiconductor device according to this embodiment as mounted on a conductive pattern. FIG. 4 is an enlarged partial perspective view of the semiconductor device according to this embodiment as mounted on the conductive pattern.

As shown in FIG. 1, a lead frame 21 includes an island 23 on which an integrated circuit chip 22 is mounted, a plurality of discrete leads 24A, 24B, 24C, . . . , and 25A, 25B, 25C, . . . , which act as external electrode terminals, and a plurality of common leads 24M, 24N, 24P, 24Q, 25M, 25N, 25P, and 25Q, which are coupled to the island 23.

The island 23 is located in the center of the lead frame 21. A plurality of discrete leads 24A and the like, and a plurality of common leads 24M and the like are arranged in DIP form and spaced at predetermined intervals on both sides of the island 23. The common leads 24M and the like have one ends coupled to the island 23, and the other ends which extend to the outside of the island 23 so as to act as outer portions. The common leads 24M and the like are arranged adjacently to one another in the center of arrays of leads located on both sides of the island 23. The discrete leads 24A and the like are arranged on both sides of arrangements of the common leads 24M and the like, and the number of discrete leads arranged on one sides of the arrangements of the common leads is the same as the number of discrete leads arranged on the other sides thereof.

In this embodiment, coupling portions 30 are used to connect the outer portions of the common leads 24M and the like. Generally, tie bars 29 are used to couple the common leads 24M and the like and couple the discrete leads 24A and the like, so that the tie bars 29 prevent resin from leaking when resin molding is performed. In this embodiment, the coupling portions 30 are located at the middle positions between the tie bars 29 and the ends of the common leads 24M and the like. Since the common leads 24M and the like have one ends coupled to the island 23, the common leads have a common potential (i.e., a ground potential) as viewed in terms of electric potential. Hence, the presence of the coupling portions 30 causes no problem in using the semiconductor device.

The integrated circuit chip 22 is mounted on the island 23 of the above-mentioned lead frame 21 with a conductive adhesive such as silver paste. Many electrodes 26A, 26B, 26C, . . . , and 27A, 27B, 27C, . . . placed on the integrated circuit chip 22 are bonded to the discrete leads 24A and the like through fine metal wires 28. Electrodes 26M, 26N, . . . , and 27M, 27N, . . . having a ground potential are bonded to the common leads 24M and the like through the fine metal wires 28.

Then, by transfer molding, the lead frame 21, the integrated circuit chip 22, and the inner portions of the leads are molded with resin, thereby forming a resin-sealing body 31. After molding, the tie bars 29 are cut off so that the discrete leads 24A and the like are electrically independent. Therefore, the common leads 24M and the like are coupled by the coupling portions 30.

As shown in FIG. 2, the discrete leads 24A and the like, and common leads 24M and the like which project out from both sides of the resin-sealing body 31, are each curved and formed into a gull-wing shape. In this case, the coupling portions 30 are located in the vertical portions of the common leads 24M and the like.

As shown in FIG. 3, in a completed semiconductor device 32, the discrete leads 24A and the like, and common leads 24M and the like, which project out from the resin-sealing body 31, are bonded to corresponding conductive patterns 34A, 34B, 34C, . . . on a printed wiring board 33 with brazing material (e.g., solder or the like).

As shown in FIG. 4, when bonding is performed, plenty of conductive adhesive, such as brazing material (e.g., solder or the like) 35, adheres to the curved portions of the common leads 24M and the like coupled by the coupling portions 30. Thus, the brazing material (e.g., solder or the like) 35 adheres to space between the common leads 24M and the like with the coupling portions 30 therebetween, so that the common leads 24M and the like are bridged with the brazing material (e.g., solder or the like) 35. This is accomplished by utilizing the surface tension of the brazing material (e.g., solder or the like) 35. The space between the common leads 24M and the like is filled with the brazing material (e.g., solder or the like) 35, so that the common leads 24M and the like function as a large lead.

With this structure, the common leads 24M and the like have a large surface area and a great thickness. Thus, the heat generated by the integrated circuit chip 22 is transferred from the island 23 to the common leads 24M and the like, which are bridged with the brazing material (e.g., solder or the like) 35. Then, the generated heat is dissipated to the outside of the resin-sealing body 31.

As a result of practical experiments, it has been shown that the structure having the coupling portions 30 for coupling the common leads 24M and the like can achieve a twofold or more improvement in a heat dissipation effect, as compared to conventional structures not having the coupling portion 30.

Figure 5A:
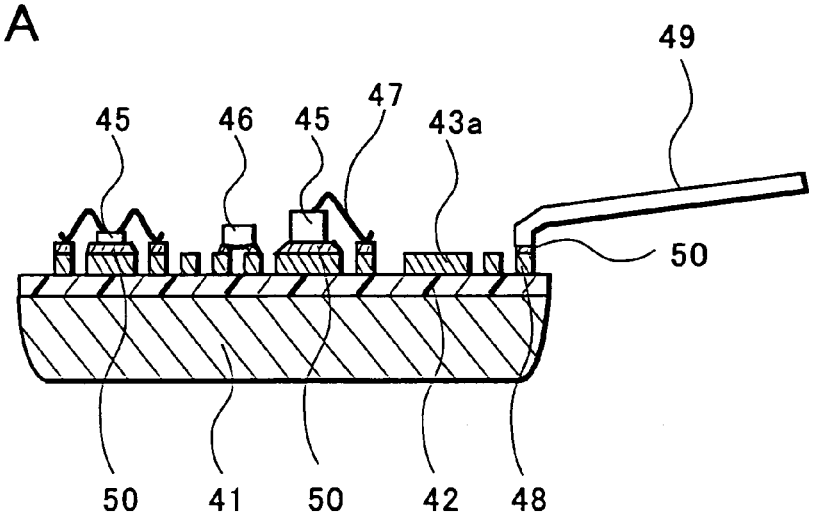
FIGS. 5A and 5B are a cross-sectional view and a plan view, respectively, explaining a hybrid integrated circuit board according to a second embodiment of the invention.

Next, the description is given with reference to FIGS. 5A to 7 with regard to a hybrid integrated circuit device according to a second embodiment of the present invention. FIG. 5A is a cross-sectional view explaining a hybrid integrated circuit board according to this embodiment. FIG. 5B is a plan view explaining the hybrid integrated circuit board according to this embodiment.

As shown in FIG. 5A, a board having excellent heat dissipation characteristics is adopted as a hybrid integrated circuit board 41, taking into account the heat generated by a semiconductor element and the like mounted on the board 41. In this embodiment, the description is given with regard to the case in which an aluminum (hereinafter referred to simply as "Al") board 41 is used. Although the Al board is used as the board 41 in this embodiment, the board is not necessarily limited to this.

For example, a printed board, a ceramic board, a metal board, or the like may be used as the board 41 to implement this embodiment. A board made of copper (Cu), iron (Fe), an iron-nickel alloy (Fe—Ni), aluminum nitride (AlN), or the like may be used as the metal board.

The board 41 has an anodized surface, and the overall anodized surface is coated with insulating resin 42 having excellent insulating characteristics such as epoxy resin.

A conductive path 43a made of copper foil is formed on the insulating resin 42. An active element 45 such as a power transistor, a small signal transistor, or an IC (integrated circuit), and a passive element 46 such as a chip resistor or a chip capacitor are mounted on the conductive path 43a with conductive material such as brazing material (e.g., solder or the like) 50. The active element 45 and the like may be electrically connected to the conductive path 43a with silver (Ag) paste or the like. In the case of face-up mounting of the active element 45 such as the IC, electrodes of the IC and the like are bonded to the conductive path 43a through fine metal wires 47. An outer lead 49 made of conductive material such as Cu or Fe—Ni is connected to an external connect terminal 48 placed on the outer periphery of the board 41 with the brazing material (e.g., solder or the like) 50 or the like.

Figure 5B:
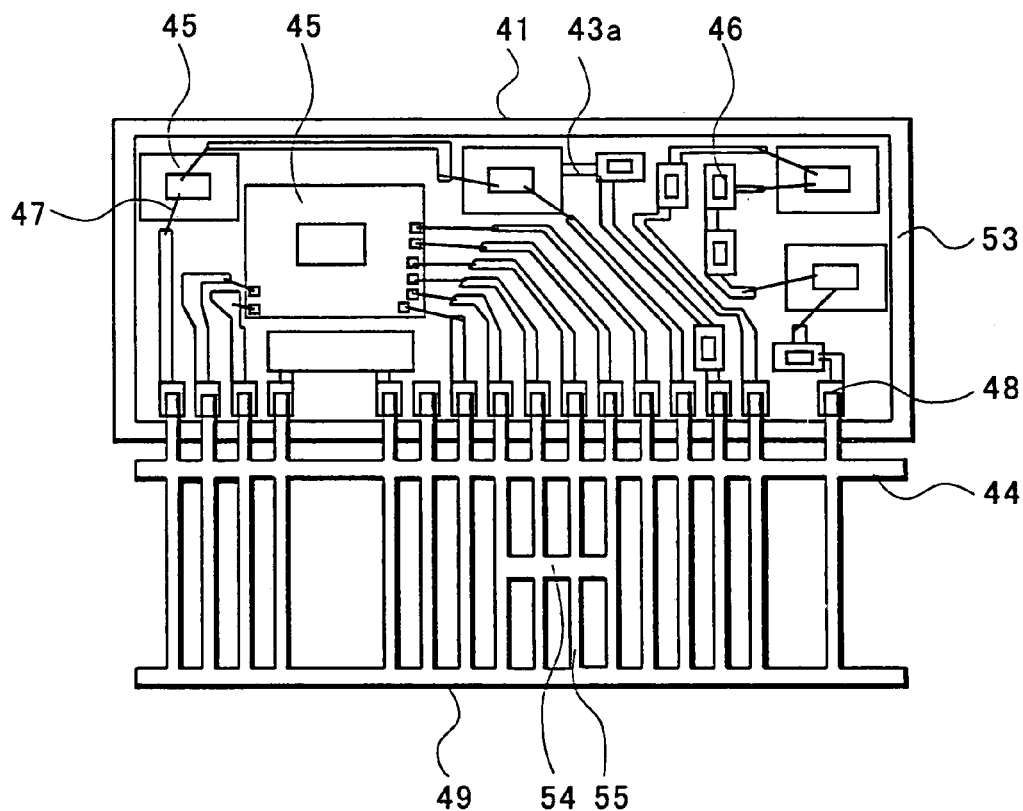

As shown in FIG. 5B, the conductive path 43a is formed on the board 41.

Moreover, the outer leads 49 are coupled by a tie bar 44 near the board 41 so that the tie bar 44 prevents resin from leaking when resin molding is performed. A part of the outer leads 49 have a coupling portion 54 between the tie bar 44 and the ends of the outer leads 49, and are thus used as common leads 55A, 55B, 55C, and 55D. Since the common leads 55A and the like are coupled by the coupling portion 54, the common leads 55A and the like have a common potential (i.e., a ground potential) as viewed in terms of electric potential.

Figure 6A:
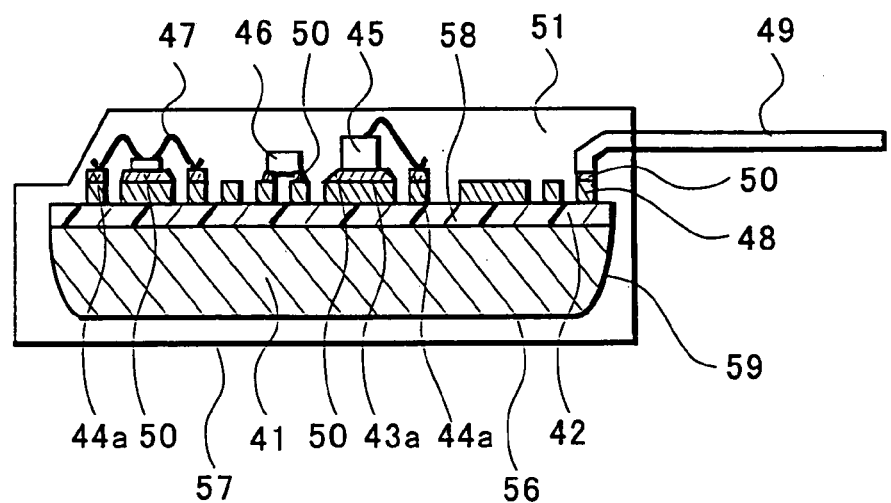
FIGS. 6A and 6B are a cross-sectional view and a plan view, respectively, explaining a hybrid integrated circuit device according to the second embodiment of the invention.
Figure 6B:
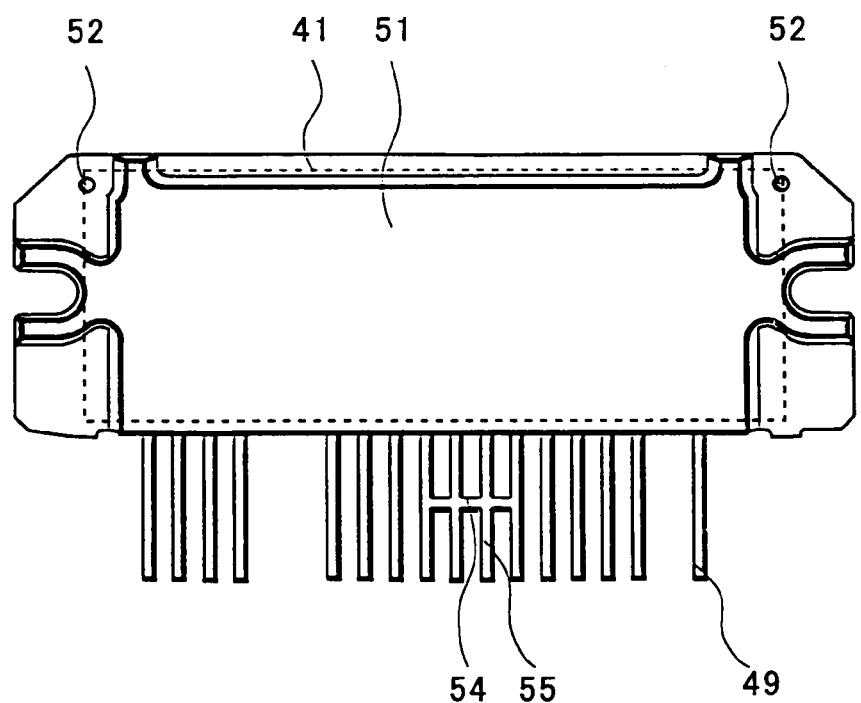

Next, FIG. 6A is a cross-sectional view explaining the hybrid integrated circuit device according to this embodiment. FIG. 6B is a plan view explaining the hybrid integrated circuit device according to this embodiment.

As shown in FIG. 6A, the overall surface of the board 41 is coated with the insulating resin 42, and thereafter a complicated circuit is formed on the insulating resin 42, and the outer lead 49 is bonded to the board 41 through the external connect terminal 48. Then, by transfer molding with thermosetting resin, a resin-sealing body 51 is formed. The thermosetting resin has low viscosity and also has a lower curing temperature than the melting point (e.g., 183 degrees centigrade) of the brazing material (e.g., solder or the like) 50. Thus, the inflow of the thermosetting resin while transfer molding does not cause falling-down, breaking, or bending of a fine Al wire having a diameter of about 40 μm, for example.

Moreover, in this embodiment, a die-cut surface 56 of the board 41 is located on the side of a rear surface 57 of the resin-sealing body 51. In other words, the conductive path 43a and the like are formed on a surface 58 of the board 41 which is opposite to the die-cut surface 56 of the board 41. A curved surface 59 is formed on the die-cut surface 56 of the board 41 while die-cutting the board 41. While transfer molding, filling of resin is performed from a bottom surface of the board 41. In this case, the curved surface 59 of the board 41 is utilized for smooth filling of the resin.

As shown in FIG. 6B, holes 52 are formed in an outer periphery 53 of the board 41 (see FIG. 5B), that is, a region of the board 41 on which the circuit and the like are not formed. Since the holes 52 are formed in the region belonging to both the outer periphery 53 of the board 41 and the insulating resin 42, the structure has no problem in quality and moisture resistance. Moreover, the outer periphery 53 is provided in order to ensure a distance from a circuit region when pressing each board 41 separately. After all, the outer periphery 53 is dead space, which is effectively used as a contact region for pins to fix the board 41 while transfer molding.

Moreover, in this embodiment, the board having excellent thermal conductivity is used as the board 41, so that the overall board 41 can be utilized as a heat sink, which can prevent temperatures of elements mounted on the board 41 from rising by the heat. Moreover, generated heat can be dissipated to the outside of the resin-sealing body 51 through the board 41. Therefore, this embodiment includes the metal board 41 directly molded, so that superior heat dissipation characteristics can be achieved and thus circuit characteristics can be improved, as compared to the semiconductor device using the lead frame.

Figure 7:
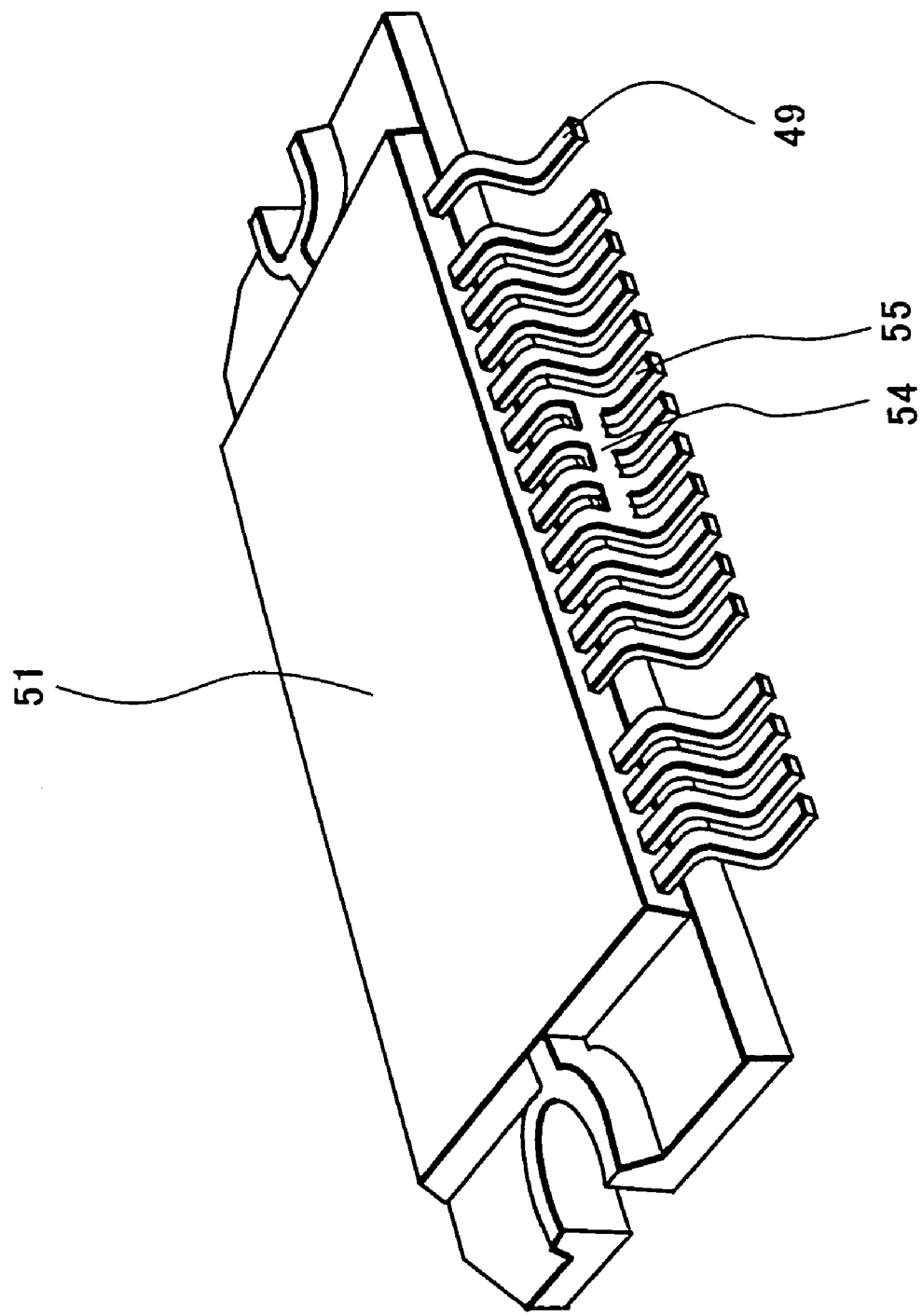
FIG. 7 is a perspective view explaining the hybrid integrated circuit device according to the second embodiment of the invention.
Figure 8:
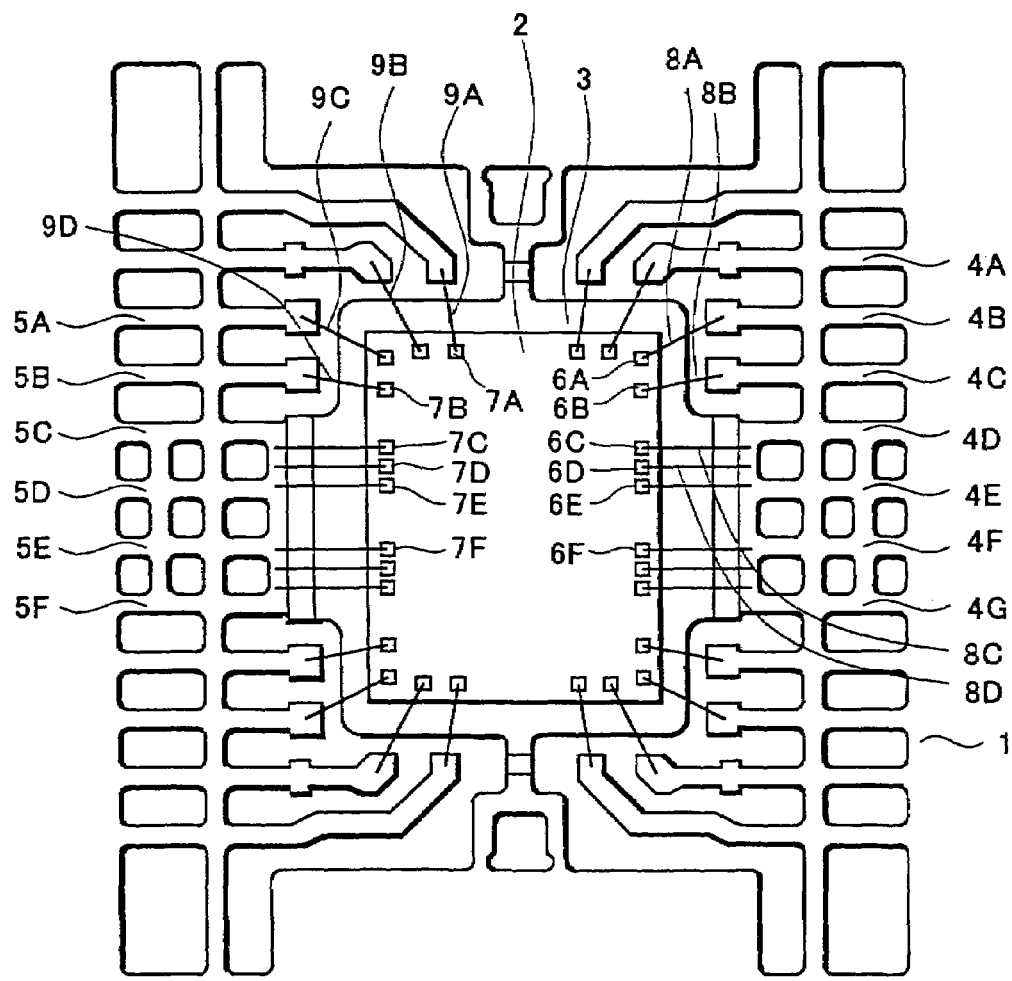
FIG. 8 is a plan view explaining a lead frame for use in a conventional semiconductor device.
Figure 9:
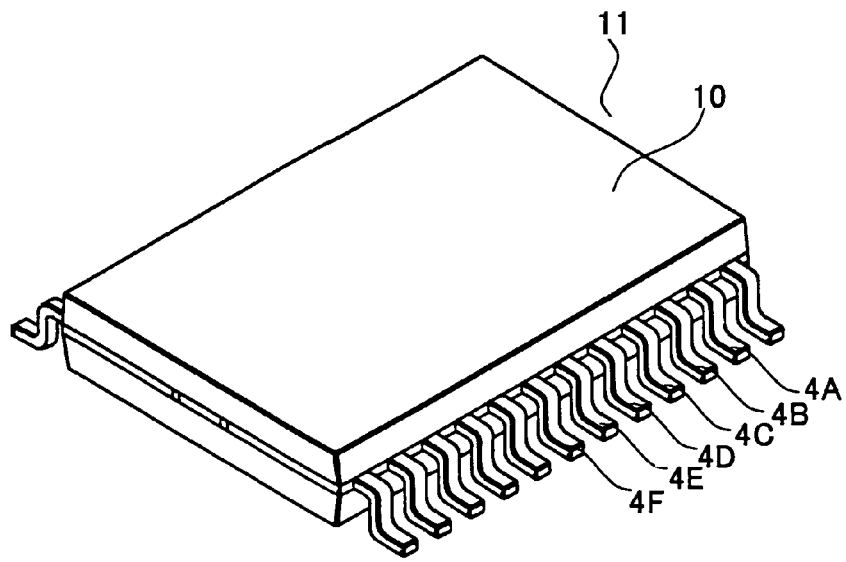
FIG. 9 is a perspective view explaining the conventional semiconductor device.
Figure 10:
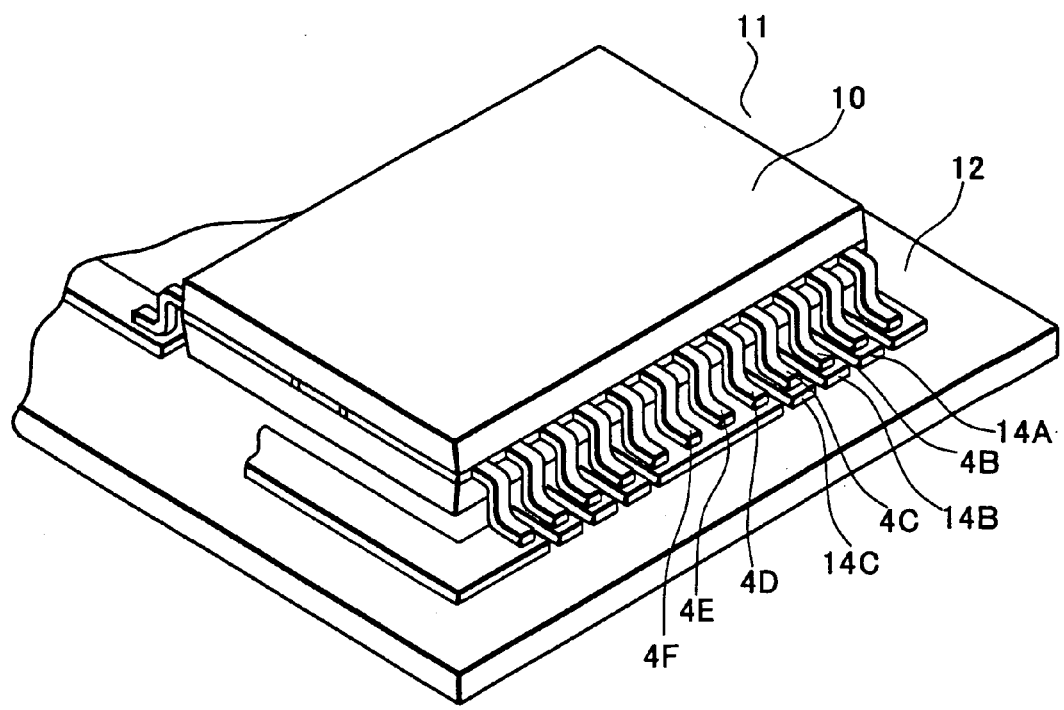
FIG. 10 is a perspective view explaining the conventional semiconductor device as mounted on a conductive pattern.

Next, FIG. 7 is a perspective view explaining the hybrid integrated circuit device according to this embodiment.

As shown in FIG. 7, the outer leads 49 projecting out from one side of the resin-sealing body 51 are each curved and formed into a gull-wing shape. In this case, the common leads 55A and the like are also formed into the gull-wing shape, and the coupling portion 54 is located in the vertical portions of the common leads 55A and the like. Then, the outer leads 49 are bonded to corresponding conductive patterns on a printed wiring board with brazing material (e.g., solder or the like), as shown in FIG. 4 of the first embodiment.

As in the case of the first embodiment described above, the brazing material (e.g., solder or the like) 50 adheres to space between the common leads 55A and the like with the coupling portion 54 therebetween, so that the common leads 55A and the like are bridged with the brazing material (e.g., solder or the like) 50. This is accomplished by utilizing the surface tension of the brazing material (e.g., solder or the like) 50. The space between the common leads 55A and the like is filled with the brazing material (e.g., solder or the like) 50, so that the common leads 55A and the like function as a large lead.

With this structure, the common leads 55A and the like of the outer leads 49 each have a large surface area and a great thickness. Thus, the heat generated by the active element 45 or the passive element 46 is transferred from the board 41 to the common leads 55A and the like bridged with the brazing material (e.g., solder or the like) 50. Then, the generated heat is dissipated to the outside of the resin-sealing body 51.

Note that, in the second embodiment, the description has been given with regard to the case in which the outer leads extend from one side of the board. However, the preferred embodiment of the present invention is not limited to this case. For example, the outer leads may extend from opposite sides of the board. In this case, the above-mentioned heat dissipation characteristics also can be improved. In addition, various modifications are possible within a range not departing from the gist of the invention.

The semiconductor device of the preferred embodiments includes the island having the integrated circuit chip mounted thereon, the common leads, the coupling portion, and the brazing material with which the common leads are bridged. The common leads, the coupling portion, and the brazing material enable efficient dissipation of the heat generated by the integrated circuit chip to the outside of the resin-sealing body. Thus, this structure can prevent the integrated circuit chip or the semiconductor device itself from being damaged by the heat.

Moreover, in the semiconductor device of the preferred embodiments, is obtained the effect that the brazing material used for bridging allows an increase in the widths of the common leads, even when a larger number of pins formed from the leads are adopted, or a larger number of pins are adopted in an extremely thin metal board. Moreover, the thicknesses of the common leads can be equivalently increased, so that heat dissipation characteristics can be improved.

Furthermore, in the semiconductor device of the preferred embodiments, the discrete leads and the common leads are each formed into the gull-wing shape, so that plenty of brazing material can adhere to the curved portions of the common leads. Thus, when the common leads are bonded to the conductive patterns with the brazing material, the surface tension of the brazing material can be utilized to realize the structure that facilitates bridging the common leads.

In the hybrid integrated circuit device of the preferred embodiments, the top surface of the metal board is coated with the insulating resin. The conductive pattern is formed on the insulating resin surface, and the active element and the passive element are mounted on the conductive pattern. The resin-sealing body is formed so as to coat the pattern and the elements. The heat generated by the active element or the passive element can be dissipated through not only the metal board but also the outer leads projecting out from the resin-sealing body. The common leads are formed in the outer leads, thus, heat dissipation characteristics can be further improved.

What is claimed is:

1. A semiconductor device including:
   an island on which a semiconductor element is mounted;
   a plurality of discrete leads each having an end extending near the island;
   a plurality of common leads coupled to the island; and
   a resin-sealing body molding the semiconductor element, the island, the discrete leads, and the common leads,
   wherein the common leads projecting out from the resin-sealing body are provided with a coupling portion.

2. The semiconductor device according to claim 1, wherein the common leads are bonded to a conductive pattern with a conductive adhesive, and the common leads are bridged with the conductive adhesive between the coupling portion and the conductive pattern.

3. The semiconductor device according to claim 1, wherein the common leads are coupled to both sides of the island.

4. The semiconductor device according to claim 1, wherein the common leads are each formed into a gull-wing shape.

5. A hybrid integrated circuit device including:
   a conductive pattern formed at least on a surface of a hybrid integrated circuit board;
   a semiconductor element or a passive element mounted on the conductive pattern;
   a plurality of leads connected to the conductive pattern and extending outside, the leads acting as an output or an input; and
   a resin-sealing body made of a thermosetting resin, which coats at least the surface of the board by transfer molding,
   wherein the leads have a plurality of common leads projecting out from the resin-sealing body, and the common leads are coupled by a coupling portion.

6. The hybrid integrated circuit device according to claim 5, wherein the common leads are bonded to a conductive pattern with a conductive adhesive, and the common leads are bridged with the conductive adhesive between the coupling portion and the conductive pattern.

7. The hybrid integrated circuit device according to claim 5, wherein the common leads are each formed into a gull-wing shape.

8. The hybrid integrated circuit device according to claim 5, wherein the board is made of a metal board, and has a die-cut surface which is opposite to the surface of the board on which the conductive pattern is formed, and the die-cut surface is located on a side of a rear surface of the resin-sealing body.

9. The semiconductor device according to claim 1, wherein the coupling portion is formed between a side surface of the resin-sealing body and ends of the common leads.

10. The semiconductor device according to claim 4, wherein the coupling portion is formed on a vertical portion of the gull-wing shape.

11. The hybrid integrated circuit device according to claim 5, wherein the coupling portion is formed between a side surface of the resin-sealing body and ends of the common leads.

12. The hybrid integrated circuit device according to claim 7, wherein the coupling portion is formed on a vertical portion of the gull-wing shape.

* * * * *